United States Patent [19]

Kamins et al.

[11] 4,160,985

[45] Jul. 10, 1979

[54] PHOTOSENSING ARRAYS WITH IMPROVED SPATIAL RESOLUTION

[75] Inventors: Theodore I. Kamins, Montain View; Godfrey T. Fong, Belmont, both of Calif.

[73] Assignee: Hewlett-Packard Company, Palo Alto, Calif.

[21] Appl. No.: 854,938

[22] Filed: Nov. 25, 1977

[51] Int. Cl.² .................................................. H01L 27/14
[52] U.S. Cl. ........................................ 357/30; 357/31; 357/38; 357/89; 357/90
[58] Field of Search .................. 357/30, 31, 89, 90, 357/38

[56] References Cited

U.S. PATENT DOCUMENTS

| | | | |
|---|---|---|---|
| 3,855,611 | 12/1974 | Neilson | 357/38 |
| 3,978,511 | 8/1976 | Digoy | 357/30 |
| 4,001,864 | 1/1977 | Gibbons | 357/30 |
| 4,016,593 | 5/1977 | Konishi | 357/38 |
| 4,021,844 | 5/1977 | Gilles | 357/31 |
| 4,037,244 | 7/1977 | de Cremox | 357/30 |

Primary Examiner—Martin H. Edlow
Attorney, Agent, or Firm—Ronald E. Grubman

[57] ABSTRACT

A photosensing device is provided in which selective doping of the semiconductor substrate of the device produces electric fields in the substrate which accelerate photogenerated charge carriers toward or away from the surface of the device. The probability of detection of change carriers by photosensing elements remote from the region of carrier photogeneration is thereby reduced.

4 Claims, 4 Drawing Figures

PHOTOSENSING ARRAYS WITH IMPROVED SPATIAL RESOLUTION

BACKGROUND OF THE INVENTION

In recent years, arrays of photosensors have been used for optical imaging applications. Both photodiodes and charge-coupled devices have been employed to collect the photogenerated carriers. In both types of devices, however, the spatial resolution obtainable may be limited by diffusion of the photogenerated carriers within the semiconductor itself, even if other components of the optical system are optimized and scattered light is reduced. This occurs because a carrier photogenerated under one sensor can diffuse a significant distance in the underlying semiconductor substrate to be collected in the space-charge region of a distant sensor, thereby giving a spurious signal. This type of interaction may be termed "crosstalk" by analogy with the unwanted interactions encountered in communication systems. Such optical crosstalk between photosensing elements limits the spatial resolution of the array.

In U.S. Pat. No. 4,025,943, entitled "Photogeneration Channel in Front Illuminated Solid State Silicon Image Devices" there is disclosed a scheme for reducing crosstalk in which a thin layer of one conductivity type is externally biased with respect to a substrate of opposite conductivity type to prevent carriers from migrating to distant photosensors. However, the use of this device is complicated by the need for an external bias supply. Additionally, the presence of layers of two different conductivity types over the entire surface makes this structure less compatible with the integration of other circuitry into the same semiconductor chip.

SUMMARY OF THE INVENTION

In accordance with the illustrated preferred embodiments, the present invention provides a photosensing array in which spatial resolution is improved by incorporating subsurface electric fields which accelerate the photogenerated carriers toward or away from the surface of the device so that the carrier diffusion to distant photosensing elements is minimized. The subsurface fields are obtained by incorporating suitable dopant concentration gradients into the structure. In one preferred embodiment the subsurface field is formed using a heavily doped "buried layer" and a lightly doped epitaxial film over a lightly doped substrate, all of the same conductivity type. This structure can be readily made compatible with the incorporation of other semiconductor devices in the same monolithic substrate by spatially limiting the extent of the buried layer. The invention has application in a photodiode array fabricated in a silicon integrated circuit, or in other types of photosensing arrays, such as charge-coupled devices (CCD's).

DESCRIPTION OF THE INVENTION

Figure 1:
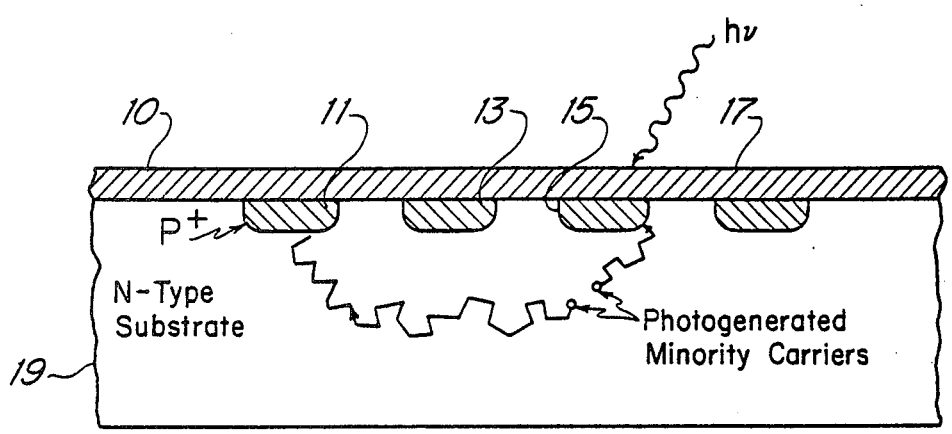
FIG. 1 is a cross-section of conventional photodiode array with a uniformly doped substrate.

FIG. 1 schematically illustrates a cross-section of a conventional photodiode array, formed by diffusing dopant impurities through an insulating masking layer 10 (typically of $SiO_2$) into a uniformly doped substrate 19 of conductivity type opposite that of the diffused regions. Thus, P+-type photosensors 11, 13, 15 and 17 may be formed in an N-type substrate 19. When incident light strikes the region above one photosensor (e.g. in FIG. 1) electron-hole pairs are photogenerated in the neutral, uniformly doped, semiconductor substrate 19. The minority-carriers so generated move by random thermal diffusion throughout the substrate. Those which arrive at a photosensor will recombine there and contribute to a signal current indicating that light has been incident on the device in the vicinity of that sensor. Although some carriers arrive at the depletion-region edge of the nearest sensor (15 in FIG. 1), others may diffuse to distant sensors before recombining and may be collected, e.g. by sensor 11. This diffusion degrades the spatial resolution of the array since the electrical signal from a carrier collected at sensor 11 appears to be caused by light incident near sensor 11 rather than near sensor 15. The crosstalk is greater for penetrating, long-wavelength light since carriers created deep within the substrate have a greater probability of diffusing to distant sensors than do carriers generated close to the surface.

Figure 2:
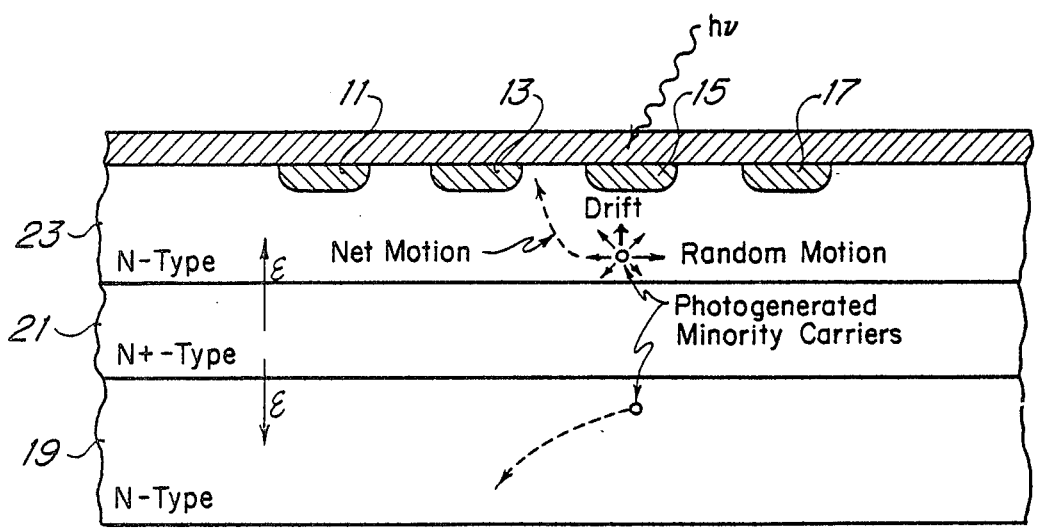
FIG. 2 is a cross-section of photosensing structure which incorporates subsurface electric fields to superpose a drift component on the random motion of the photogenerated carriers.

In FIG. 2 there is shown a photosensor array in which crosstalk is significantly reduced by incorporating built-in electric fields into the structure so that a directional drift motion is superposed on the random thermal diffusion of the charge carriers. In the structure of FIG. 2, subsurface electric fields are induced by means of suitable dopant concentration gradients introduced into substrate 19. In particular, a highly doped "buried layer" region 21 of the same conductivity type as substrate 19 is selectively introduced into the substrate, e.g. by diffusion or by ion implantation. In an exemplary embodiment, substrate 19 may be taken as an N-type region, so that highly doped region 21 will be an N+-type region. Substrate 19 may be of silicon doped with phosphorus to about $10^{15}$ cm$^{-3}$, while an ion-implanted phosphorus dose of about $3\times 10^{15}$ cm$^{-2}$ creates N+ region 21. Region 21 may be limited laterally to be coextensive with the photosensing array, which facilitates incorporation of the array on the same N-type substrate as other semiconductor devices. A silane epitaxial film 23 about 10 $\mu$m thick and doped similarly to substrate 19 is grown over region 21. The device is then preferably subjected to a long diffusion (e.g. 10 hours at 1100° C.) to redistribute the phosphorus buried layer through a substantial fraction of the epitaxial film. At this point the structure is completed in a conventional manner by fabrication of photosensing elements and the associated integrated-circuit structures. In preferred embodiments photosensing elements 11, 13, 15 and 17 are diffused P+-N photodiodes about 32 $\mu$m wide by 200 $\mu$m long, with a center-to-center spacing of about 75 $\mu$m.

Figure 3:
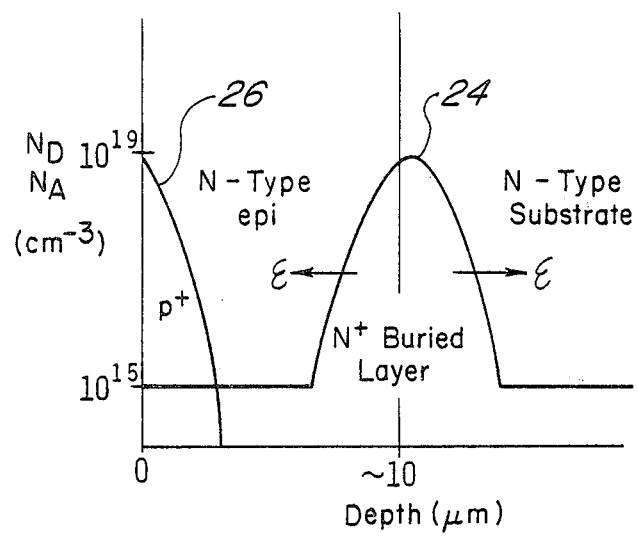
FIG. 3 schematically illustrates profiles of dopant concentrations in the substrate of a photosensing device.

FIG. 3 schematically illustrates profiles of doping concentration vs. depth into substrate 19. Curve 24 represents the N-type dopants, while curve 26 indicates the P+-type doping for photosensors 11, 13 etc. The non-uniform dopant concentration in the substrate creates electric fields in the substrate, indicated by arrows labeled "ε" in FIGS. 2 and 3. In devices fabricated as described above, the electric field in the substrate is about 460 V/cm near the surface, decreasing to 60 V/cm at 1 μm above the maximum dopant concentration. The carriers therefore tend to be accelerated either toward the nearest photosensor or away from the surface. More specifically, carriers created below the maximum dopant concentration are accelerated into the substrate where they recombine without contributing to the collected current of any sensor, while carriers created above the maximum dopant concentration are accelerated toward the surface where they increase the collected current of the adjacent photosensor. In either case, the probability of a carrier reaching a distant sensor is reduced. The field also leads to more rapid collection of photogenerated carriers, thus improving the frequency response of the device.

Figure 4:
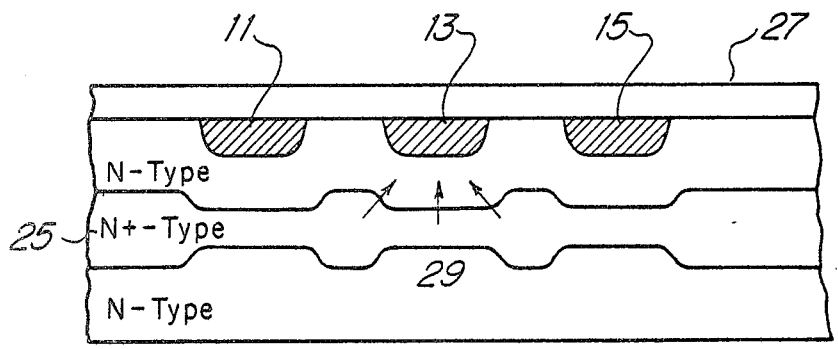
FIG. 4 is a cross-section of a photosensing structure including a "shaped" buried-layer.

In an alternate embodiment, shown in FIG. 4, the structure may be fabricated to include a lateral component of the subsurface electric field, in addition to a vertical component; photogenerated carriers will then tend to be accelerated more directly toward the closest collecting region. This is accomplished using a "shaped" N+ buried layer 25 which extends closer to the surface between diffusions 11, 13 etc. than it does directly beneath the diffusion. Thus, the built-in electric field accelerates the photogenerated carriers more directly toward the nearest photosensing diffusion, as indicated by arrows 29.

The "shaped" buried layer 25 can be formed e.g. by successive implantation of two species that diffuse at different rates. The more rapidly diffusing impurity (e.g. phosphorus) is placed only between photosensing elements, while the slowly diffusing species (e.g. arsenic) is placed beneath the entire photosensing array. After a suitable redistribution diffusion, the resulting fields tend to accelerate the photogenerated minority carriers laterally toward the nearest sensor as well as vertically toward the surface.

We claim:

1. A photosensing device comprising:
   a semiconductor substrate of a first conductivity type;
   an intermediate semiconductor layer on said substrate, said intermediate layer being of the first conductivity type but of higher conductivity than said substrate;
   a surface semiconductor layer on said intermediate layer, said surface layer being of the first conductivity type, but of lower conductivity than said intermediate layer;
   an array of photosensing elements on said surface layer for detecting charge carriers photogenerated in said surface layer and said intermediate layer by optical radiation incident on said device;
   whereby charge carriers created above the region of maximum conductivity will be accelerated toward the nearest of said photosensing elements and charge carriers created below the region of maximum conductivity will be accelerated away from said photosensing elements into said substrate.

2. A photosensing device as in claim 1 wherein:
   said array of photosensing elements comprises a plurality of semiconductor regions of a second conductivity type opposite said first conductivity type.

3. A photosensing device as in claim 2 wherein:
   said first conductivity type is N-type; and
   said second conductivity type is P-type.

4. A photosensing device as in claim 2 wherein:
   said intermediate layer is a shaped layer having regions of differing thickness to provide subsurface electric fields having both perpendicular and tangential components with respect to the surface of said device.

* * * * *

UNITED STATES PATENT AND TRADEMARK OFFICE
CERTIFICATE OF CORRECTION

PATENT NO. : 4,160,985
DATED : July 10, 1979
INVENTOR(S) : Theodore I. Kamins, et al It is certified that error appears in the above-identified patent and that said Letters Patent are hereby corrected as shown below:

Column 2, line 12, after "(e.g." insert --15--.

Signed and Sealed this

Thirteenth Day of November 1979

[SEAL]

Attest:

RUTH C. MASON
Attesting Officer

LUTRELLE F. PARKER
Acting Commissioner of Patents and Trademarks